|  US010200006B2

(12) United States Patent
Waks et al.

(10) Patent No.: US 10,200,006 B2
(45) Date of Patent: *Feb. 5, 2019

(54) BALUN FOR TRAPPING RF CURRENT ON A TRANSMISSION LINE

(71) Applicant: Life Services LLC, Minneapolis, MN (US)

(72) Inventors: Matthew T. Waks, Coon Rapids, MN (US); Scott M. Schillak, Minneapolis, MN (US); Charles A. Lemaire, Apple Valley, MN (US)

(73) Assignee: Life Services, LLC, Minneapolis, MN (US)

( * ) Notice: Subject to any disclaimer, the term of this patent is extended or adjusted under 35 U.S.C. 154(b) by 83 days.

This patent is subject to a terminal disclaimer.

(21) Appl. No.: 15/363,852

(22) Filed: Nov. 29, 2016

(65) Prior Publication Data

US 2017/0077895 A1 Mar. 16, 2017

Related U.S. Application Data

(60) Continuation of application No. 15/000,796, filed on Jan. 19, 2016, now Pat. No. 9,509,271, which is a
(Continued)

(51) Int. Cl.
*H03H 7/01* (2006.01)
*H03H 7/42* (2006.01)
(Continued)

(52) U.S. Cl.
CPC ........... *H03H 7/0115* (2013.01); *H01F 38/14* (2013.01); *H03H 1/0007* (2013.01); *H03H 3/00* (2013.01);
(Continued)

(58) Field of Classification Search
CPC .... H01P 1/202; H03H 1/0007; H03H 7/0115; H03H 7/42; H03H 7/0153
(Continued)

(56) References Cited

U.S. PATENT DOCUMENTS 3,111,634 A * 11/1963 Ammerman ........... H03C 7/027
                                              332/106
3,167,729 A    1/1965 Hall
(Continued)

OTHER PUBLICATIONS

Peterson, David M., et al., "Common Mode Signal Rejection Methods for MRI: Reduction of Cable Shield Currents for High Static Magnetic Field Systems", "Concepts in Magnetic Resonance Part B (Magnetic Resonance Engineering)", Oct. 13, 2003, pp. 18, vol. 198, No. 1.
(Continued)

*Primary Examiner* — Rakesh Patel
(74) *Attorney, Agent, or Firm* — Charles A. Lemaire; Jonathan M. Rixen; Lemaire Patent Law Firm, P.L.L.C.

(57) ABSTRACT

Apparatus and method for a radially attachable RF trap attached from a side to a shielded RF cable. In some embodiments, the RF trap creates a high impedance on the outer shield of the RF cable at a frequency of RF signals carried on at least one inner conductor of the cable. In some embodiments, an RF-trap apparatus for blocking stray signals on a shielded RF cable that has a peripheral shield conductor and a inner conductor for carrying RF signals includes: a case; an LC circuit having a resonance frequency equal to RF signals carried on the inner conductor; projections that pierce and connect the LC circuit to the shield conductor; and an attachment device that holds the case to the cable with the LC circuit electrically connected to the shield conductor of the shielded RF cable.

20 Claims, 13 Drawing Sheets

Related U.S. Application Data division of application No. 14/881,154, filed on Oct. 13, 2015, now Pat. No. 9,240,765, which is a division of application No. 13/831,752, filed on Mar. 15, 2013, now Pat. No. 9,160,295.

(51) Int. Cl.
| | | |
|---|---|---|
| *H03H 3/00* | (2006.01) | |
| *H04B 3/28* | (2006.01) | |
| *H03H 1/00* | (2006.01) | |
| *H01F 38/14* | (2006.01) | |
| *H01P 5/10* | (2006.01) | |

(52) U.S. Cl.
CPC ............ *H03H 7/0153* (2013.01); *H03H 7/42* (2013.01); *H04B 3/28* (2013.01); *H01F 2038/146* (2013.01); *H01P 5/10* (2013.01); *Y10T 29/49169* (2015.01)

(58) Field of Classification Search
USPC .......................................... 333/174, 175, 243
See application file for complete search history.

(56) References Cited

U.S. PATENT DOCUMENTS

| | | |
|---|---|---|
| 4,399,419 A | 8/1983 | Dobrovolny |
| 6,495,069 B1 | 12/2002 | Lussey et al. |
| 6,593,744 B2 | 7/2003 | Burl et al. |
| 6,605,775 B1 | 8/2003 | Seeber et al. |
| 6,664,465 B2 | 12/2003 | Seeber et al. |
| 7,622,928 B2 * | 11/2009 | Gauss ................ G01R 33/3657 324/318 |
| 8,299,681 B2 | 10/2012 | Snyder et al. |

OTHER PUBLICATIONS

Saario, S.A., et al., "Full-wave analysis of choking characteristics of sleeve balun on coaxial cables", "Electronics Letters", Mar. 28, 2002, pp. 304-305, vol. 38, No. 7.

Seeber, D.A., et al., "Floating Shield Current Suppression Trap", "Concepts in Magnetic Resonance Part B (Magnetic Resonance Engineering)", Apr. 15, 2004, pp. 26-31, vol. 21B, No. 1.

* cited by examiner

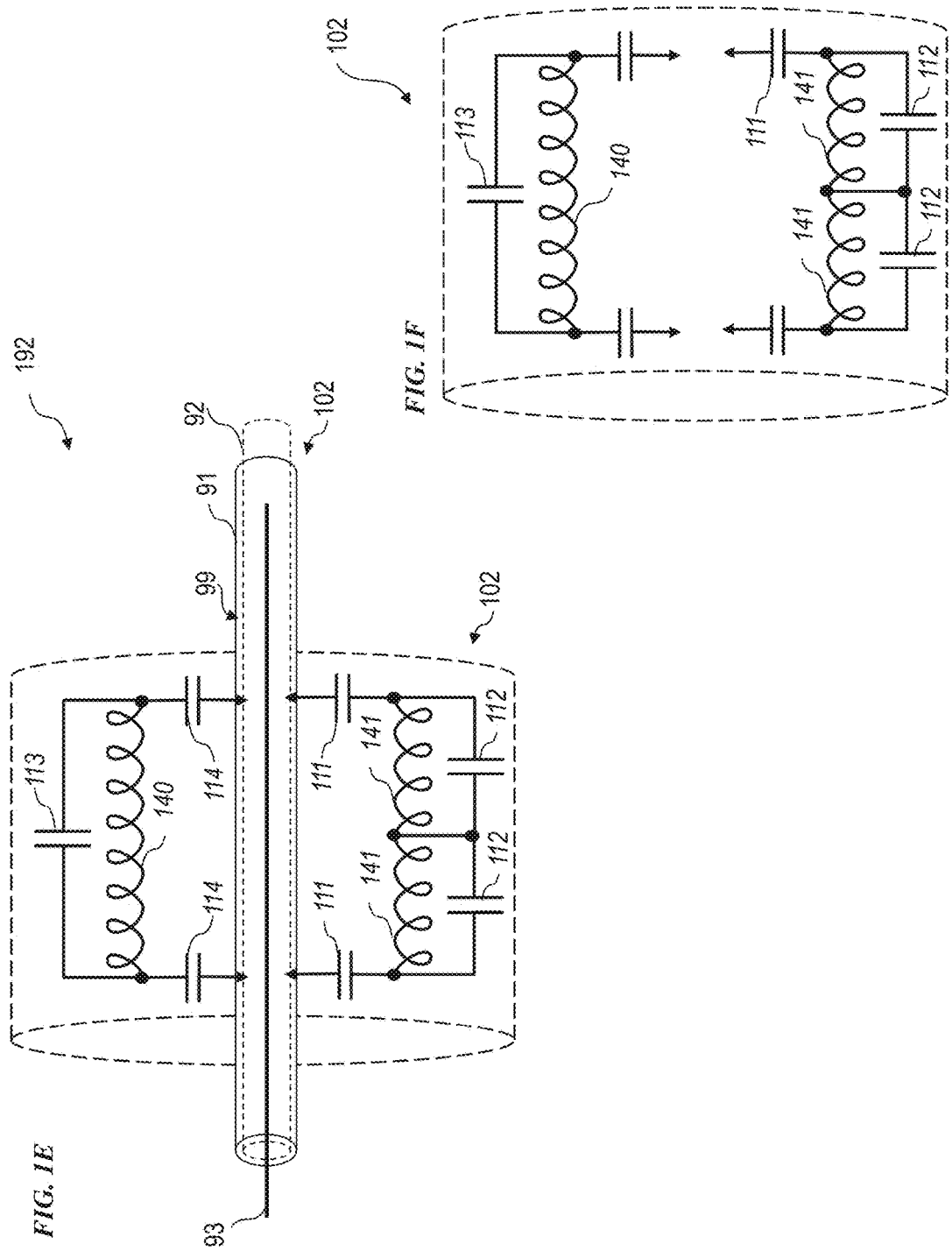

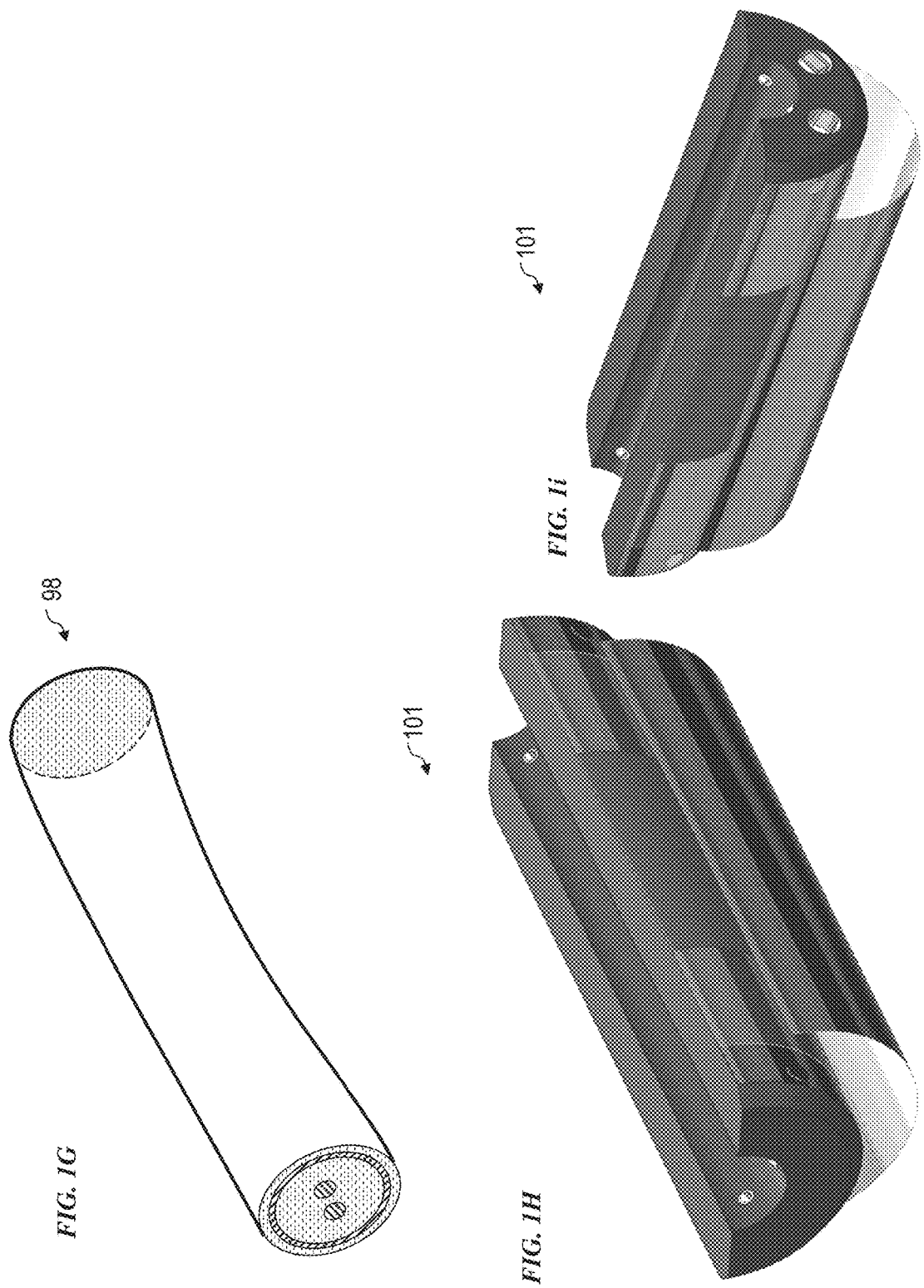

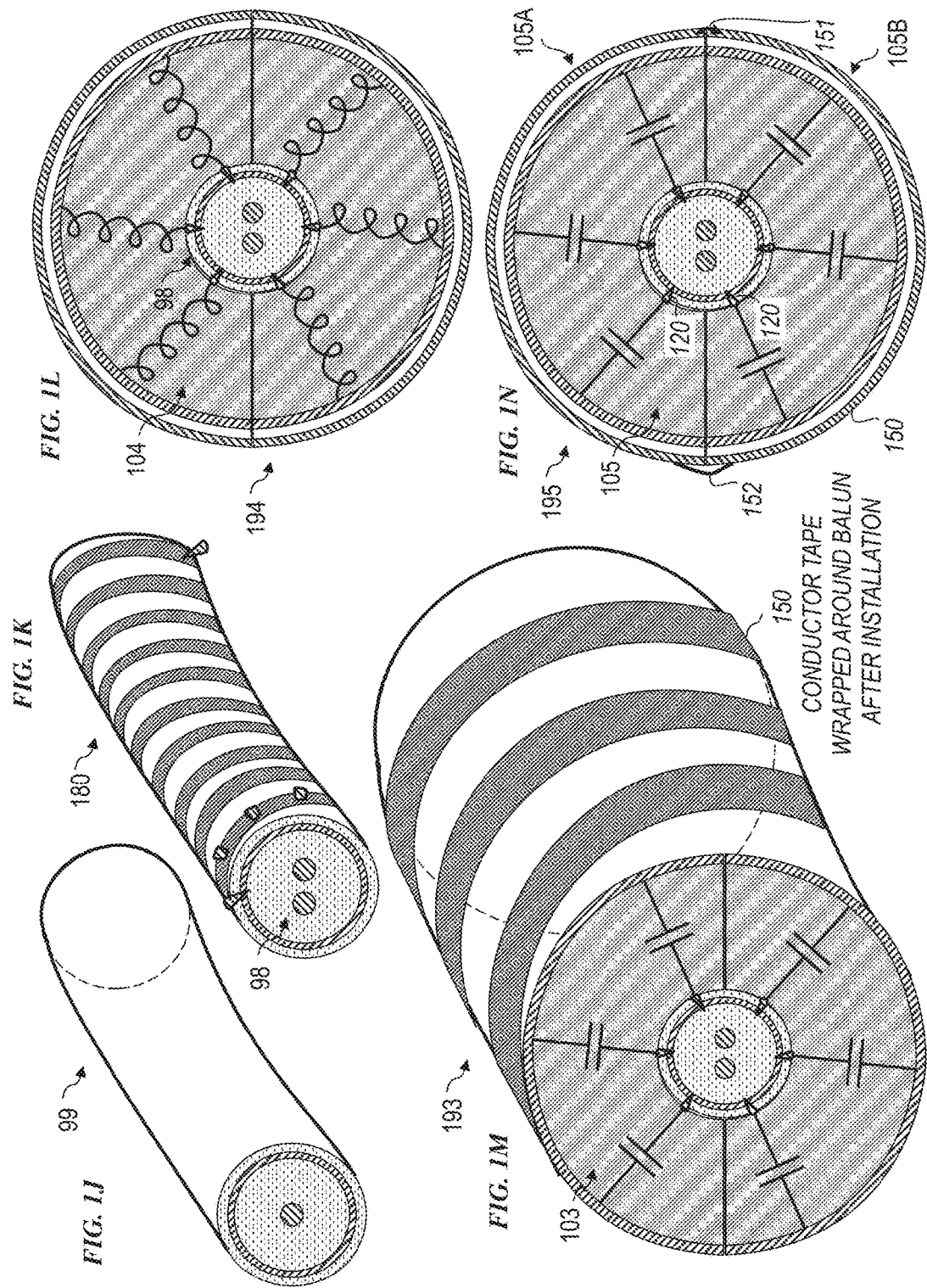

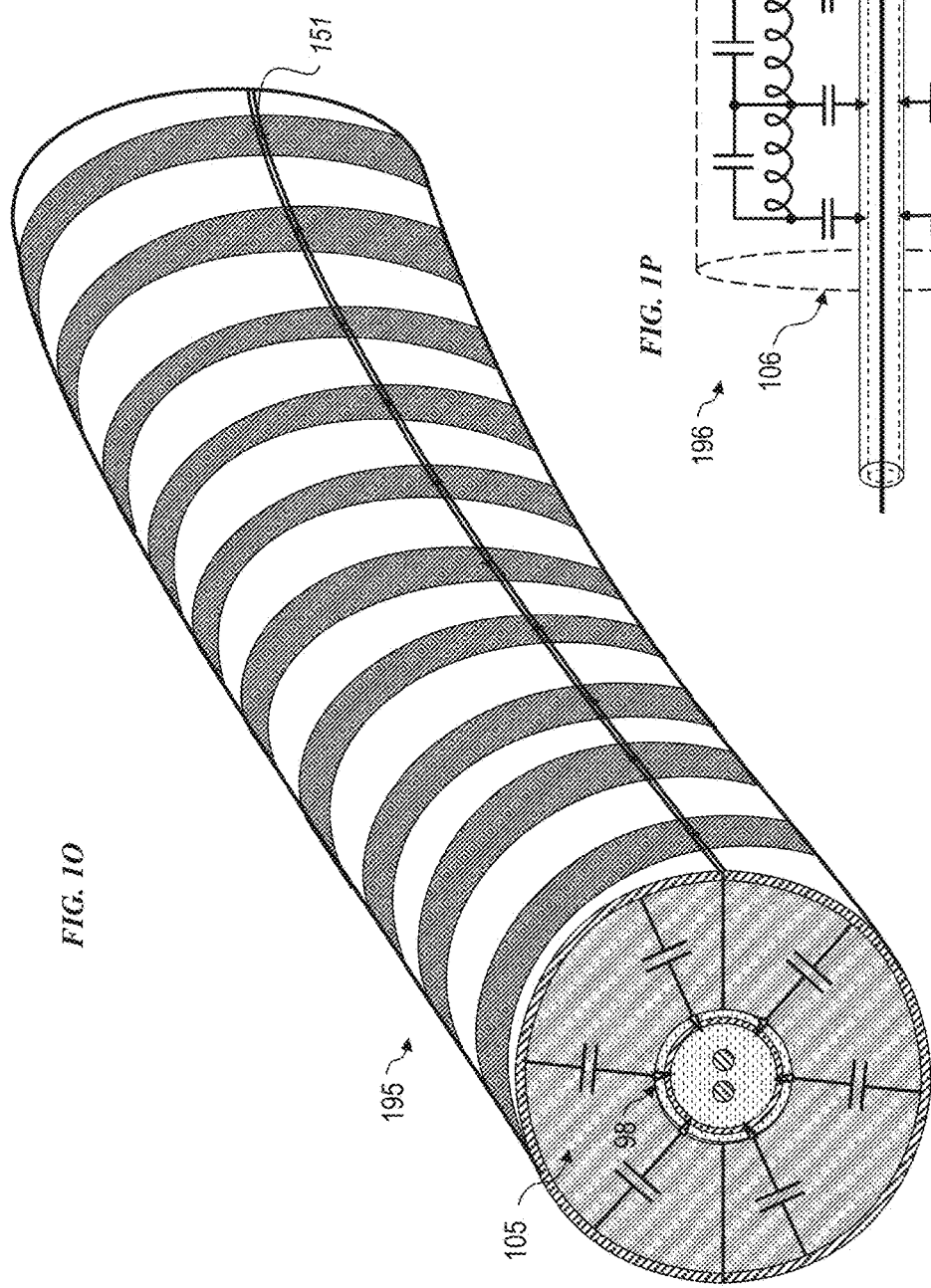
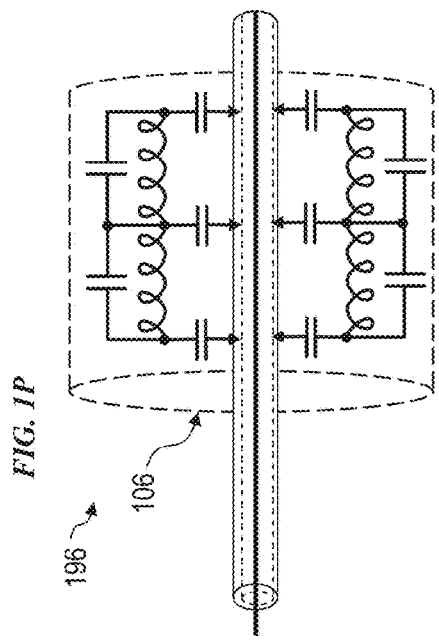

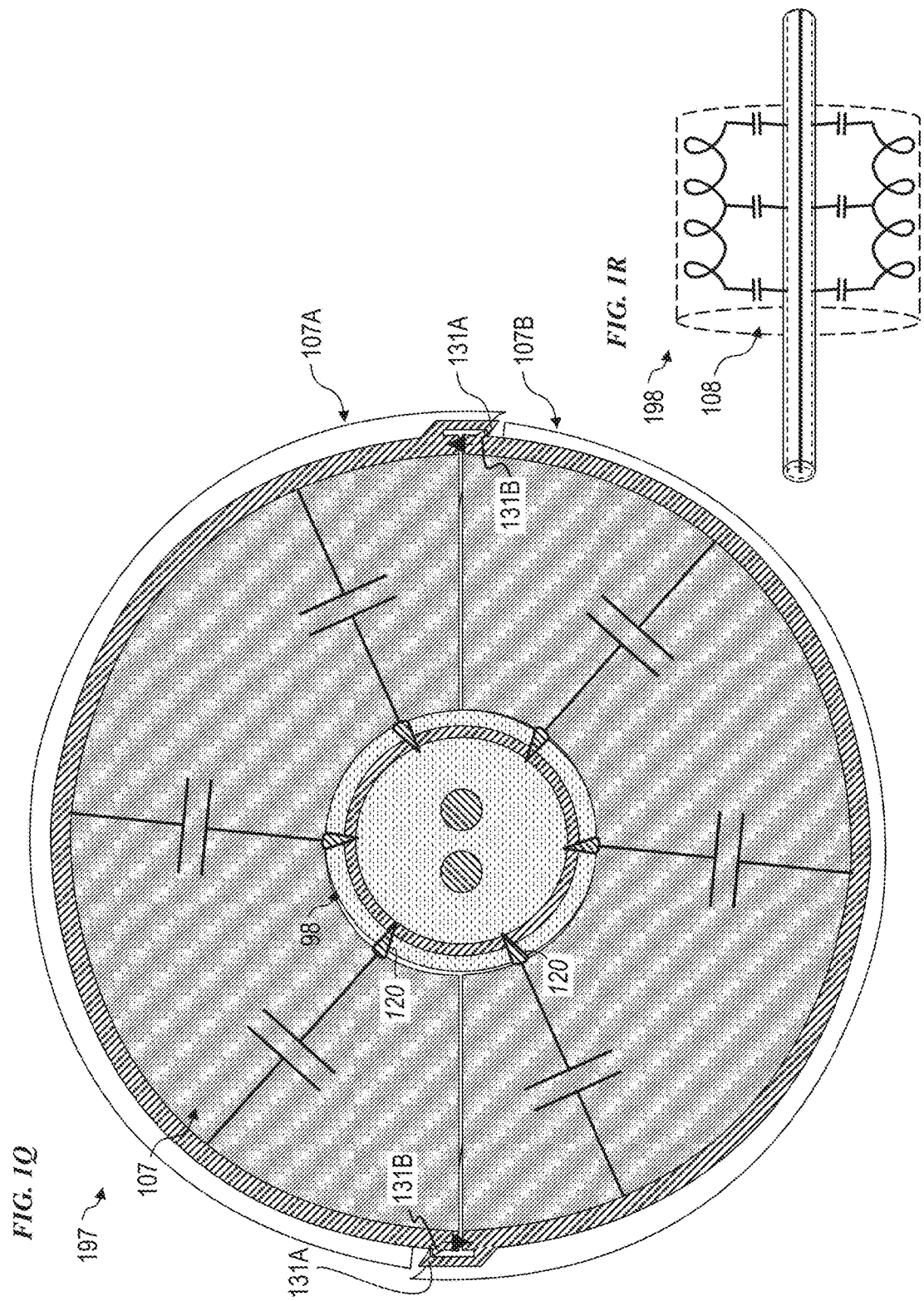

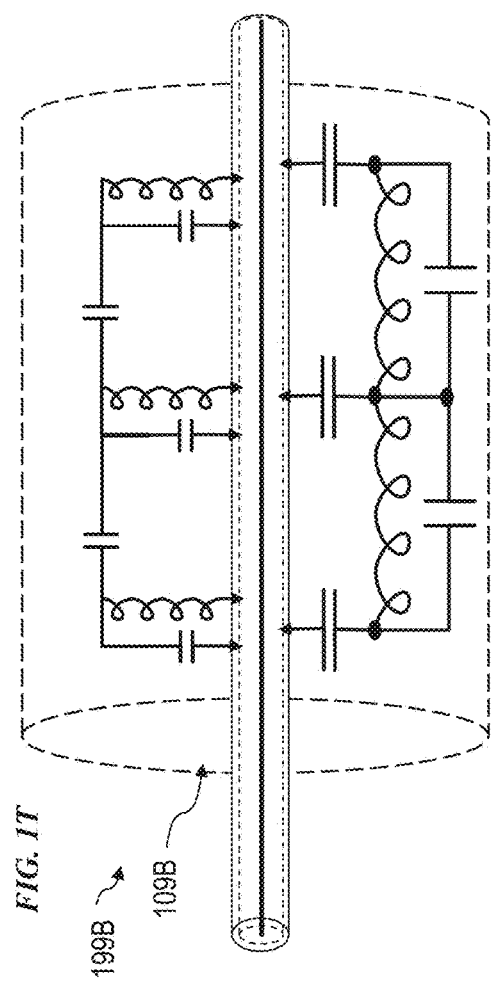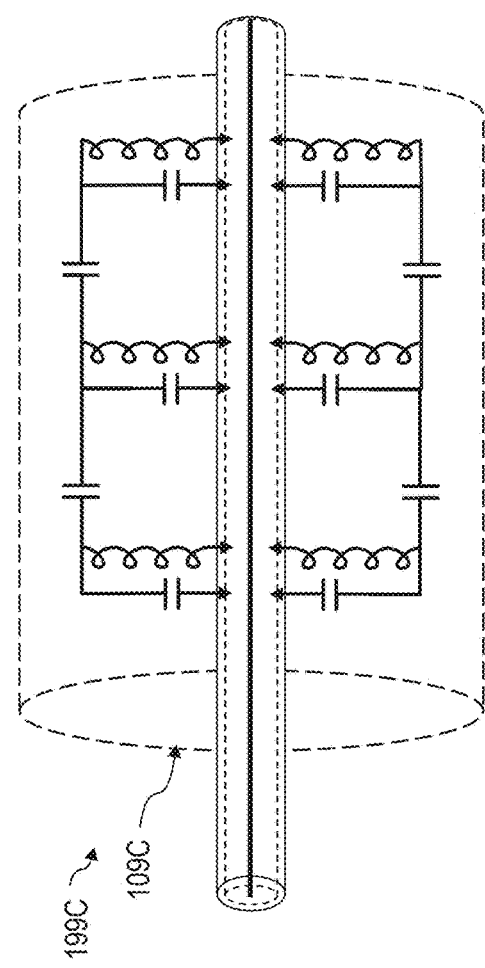

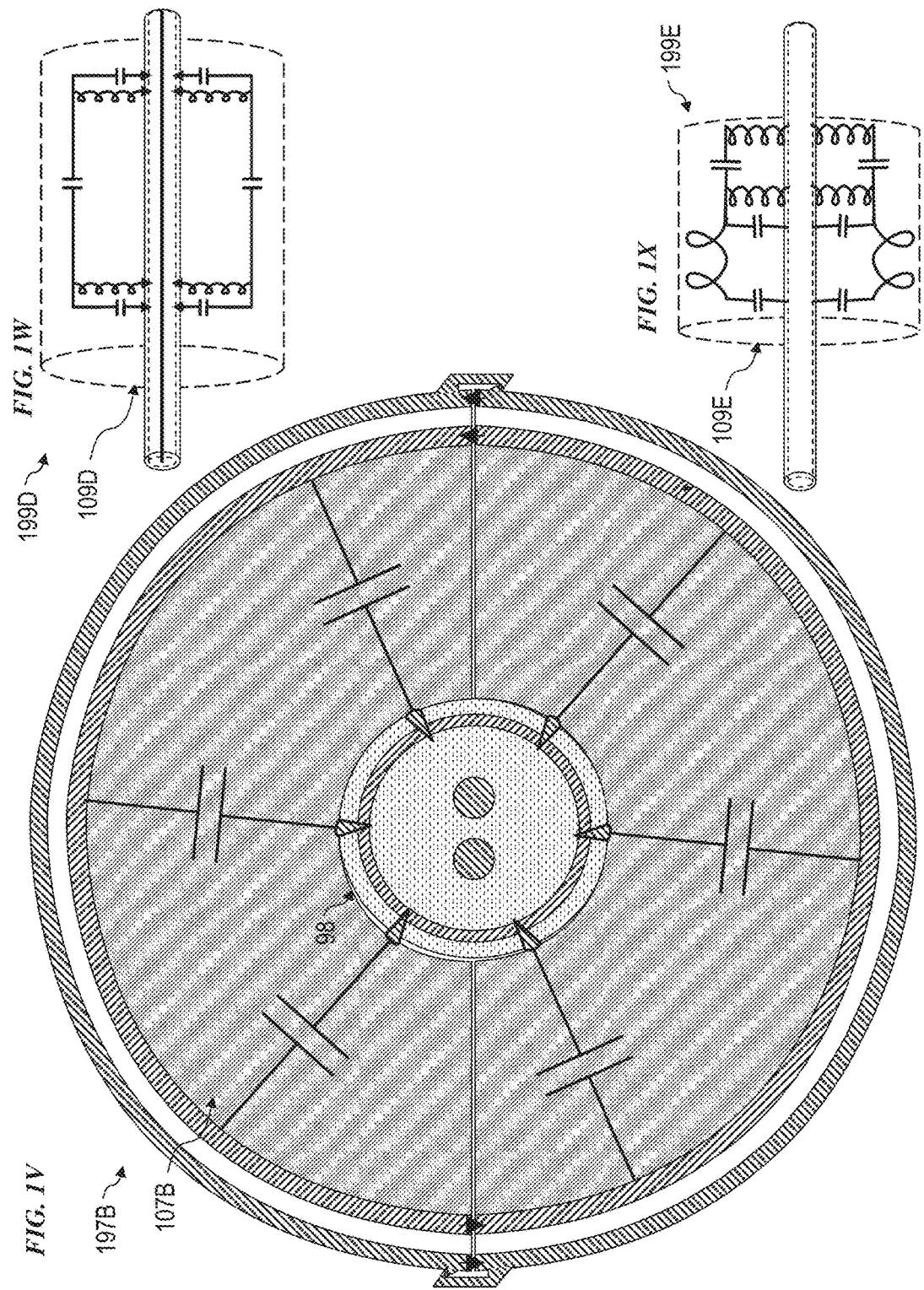

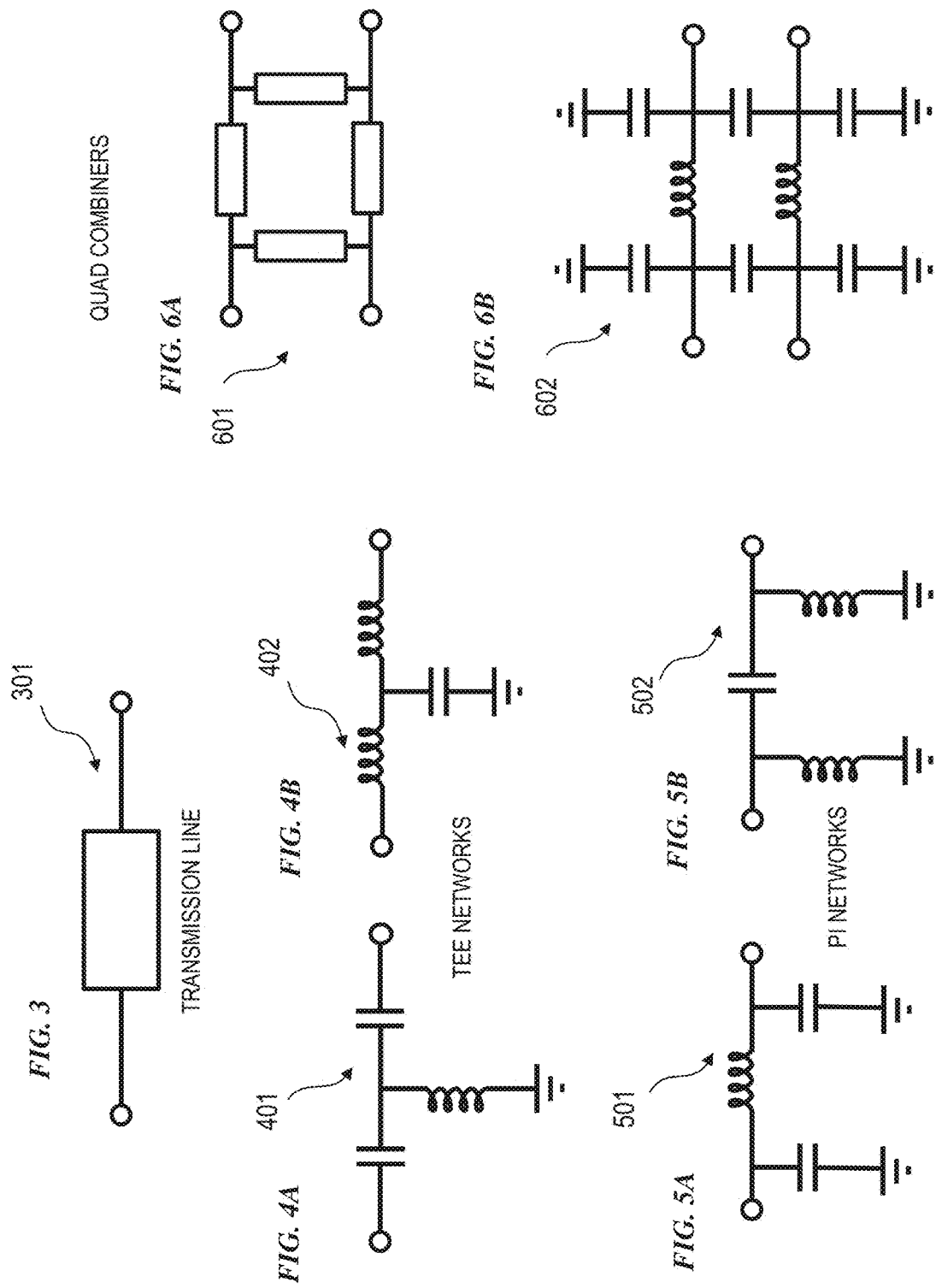

RAT RACE COUPLER

WILKINSON POWER SPLITTER/COMBINER

BALUN FOR TRAPPING RF CURRENT ON A TRANSMISSION LINE

CROSS-REFERENCE TO RELATED APPLICATIONS

This application is a continuation of U.S. patent application Ser. No. 15/000,796 filed on Jan. 19, 2016 by Matthew T. Waks et al., titled "METHOD AND BALUN FOR TRAPPING RF CURRENT ON A TRANSMISSION LINE AFTER INSTALLATION" (which issued as U.S. Pat. No. 9,509,271 on Nov. 29, 2016), which is a divisional of U.S. patent application Ser. No. 14/881,154 filed on Oct. 13, 2015 by Matthew T. Waks et al., titled "SNAP-ON COAXIAL CABLE BALUN AND METHOD FOR TRAPPING RF CURRENT ON OUTSIDE SHIELD OF COAX AFTER INSTALLATION" (which issued as U.S. Pat. No. 9,240,765 on Jan. 19, 2016), which is a divisional of U.S. patent application Ser. No. 13/831,752 filed on Mar. 15, 2013 by Matthew T. Waks et al., titled "SNAP-ON COAXIAL CABLE BALUN AND METHOD FOR TRAPPING RF CURRENT ON OUTSIDE SHIELD OF COAX AFTER INSTALLATION" (which issued as U.S. Pat. No. 9,160,295 on Oct. 13, 2015), each of which is incorporated herein by reference in its entirety.

FIELD OF THE INVENTION

This invention relates to the field of radio-frequency balance/unbalance ("balun") circuitry and more specifically to a method and RF-trap apparatus that can be attached to an installed coaxial cable from the side rather than from over an end, and, in some embodiments, for adjusting the characteristics electrically and/or mechanically.

BACKGROUND OF THE INVENTION

As used herein, the term "balun" refers to a radio-frequency (RF) cable trap that blocks stray RF current from flowing on the outside of shield conductors of coaxial RF cables.

U.S. Pat. No. 6,605,775 to Seeber et al. issued Aug. 12, 2003 with the title "Floating radio frequency trap for shield currents" and is incorporated herein by reference. Seeber et al. describe a floating shield current trap that provides first and second concentric tubular conductors electrically connected to provide a resonance-induced high impedance of current flow in a path consisting of the inner and outer conductors and their junctions thereby suppressing coupled current flow on a shield of a conductor contained within the first inner tubular conductor.

U.S. Pat. No. 6,664,465 to Seeber issued Dec. 16, 2003 with the title "Tuning system for floating radio frequency trap" and is incorporated herein by reference. Seeber describes a floating shield current trap provides two resonance loops formed of split concentric tubular conductors joined radially at their axial ends. Adjustment of the separation of these loops provides a change in coupling between the loops effecting a simplified tuning of the resonance of the trap for different expected frequencies of interfering shield current.

U.S. Pat. No. 6,593,744 to Burl et al. issued Jul. 15, 2003 with the title "Multi-channel RF cable trap for magnetic resonance apparatus" and is incorporated herein by reference. Burl et al. describe a multi-channel RF cable trap that blocks stray RF current from flowing on shield conductors of coaxial RF cables of a magnetic resonance apparatus. An inductor is formed by a curved semi-rigid trough constructed of an insulating material coated with an electrically conducting layer. Preferably, the inductor and the cable follow an "S"-shaped path to facilitate good electromagnetic coupling. The RF cables are laid in the trough and the shield conductors inductively couple with the inductor. A capacitor and optional trim capacitor are connected across the trough of the inductor to form a resonant LC circuit tuned to the resonance frequency. The LC circuit inductively couples with the shield conductors to present a signal-attenuating high impedance at the resonance frequency. The resonant circuit is preferably contained in an RF-shielding box with removable lid.

Conventional electrical components that permitted one to vary resistance, inductance, and/or capacitance under electrical control typically have somewhat limited component values available and are not compatible with being located in high fields (e.g., the fields of 1 tesla or more that are typically found in high-energy physics experiments such as the $9-billion Large Hadron Collider that has been 20 years in making and is still being modified to be able to operate).

Low-power circuits can use varactors (electrically variable capacitors), field-effect transistors (used as variable gain elements or variable resistors) and like components that are directly electrically-adjustable, for use in adjusting frequency, impedance or other circuit characteristics and parameters, however such components are often unsuitable or inoperative in high fields.

U.S. Pat. No. 6,495,069 issued Dec. 17, 2002 to Lussey et al. with the title "Polymer composition" and is incorporated herein by reference. Lussey et al. describe a polymer composition comprises at least one substantially non-conductive polymer and at least one electrically conductive filler and in the form of granules. Their elastomer material was proposed for devices for controlling or switching electric current, to avoid or limit disadvantages such as the generation of transients and sparks which are associated with the actuation of conventional mechanical switches. They described an electrical conductor composite providing conduction when subjected to mechanical stress or electrostatic charge but electrically insulating when quiescent comprising a granular composition each granule of which comprises at least one substantially non-conductive polymer and at least one electrically conductive filler and is electrically insulating when quiescent but conductive when subjected to mechanical stress. They did not propose a means for electrically activating such switches.

U.S. Pat. No. 8,299,681 to Snyder, Vaughan and Lemaire issued Oct. 30, 2012 with the title "Remotely adjustable reactive and resistive electrical elements and method" and is incorporated herein by reference. Snyder, Vaughan and Lemaire describe an apparatus and method that includes providing a variable-parameter electrical component in a high-field environment and based on an electrical signal, automatically moving a movable portion of the electrical component in relation to another portion of the electrical component to vary at least one of its parameters. In some embodiments, the moving uses a mechanical movement device (e.g., a linear positioner, rotary motor, or pump). In some embodiments of the method, the electrical component has a variable inductance, capacitance, and/or resistance. Some embodiments include using a computer that controls the moving of the movable portion of the electrical component in order to vary an electrical parameter of the electrical component. Some embodiments include using a feedback signal to provide feedback control in order to adjust and/or maintain the electrical parameter. Some embodiments include a non-magnetic positioner connected to an electrical component configured to have its RLC parameters varied by the positioner.

Conventional baluns are unitary structures that are slipped over an end of a cable and then soldered in place. This makes it difficult and inconvenient to install such a balun once both ends of the cable are connectorized and/or soldered in place.

There is a long-felt need for an RF cable trap that can be installed on a cable from the side and that blocks stray RF current from flowing on shield conductors of coaxial RF cables.

SUMMARY OF THE INVENTION

The present invention provides snap-on coaxial cable balun and method for trapping RF current on outside shield of coax after the cable is installed.

In some embodiments, one or more reactive elements of the snap-on balun of the present invention include adjustable parameters (e.g., capacitance and/or inductance) that are adjusted electrically. In other embodiments, the adjustable parameters (e.g., capacitance and/or inductance) are adjusted mechanically using electrically controlled actuators. In some embodiments, these electrically controlled mechanical-movement devices (such as piezo-electrical linear motors, micro-electronic mechanical-system (MEMS) mechanical actuators or MEMS pumps) and other elements (which are used to make the resistors, inductors, capacitors, and/or antenna elements) include metals that have only substantially non-magnetic components such that the resistors, inductors, capacitors, robotic arms or similar mechanical devices, and/or antenna elements and the mechanical positioner(s) or pump(s) that adjust their variable values can be placed and operated within and/or near an extremely high electric field of many thousands of volts per meter (such as connected to or affecting electricity-transmission lines carrying hundreds of thousands of volts and very large currents), or extremely-high magnetic field such as within the very strong superconducting-wire magnets of high-energy particle-physics experiments (such as the Large Hadron Collider) or within magnets of a magnetic-resonance imaging machines, or during and after an electromagnetic pulse (EMP) from a nuclear event.

In other embodiments, the present invention provides the ability to adjust very sensitive circuits that do not involve high fields, but instead involve very low fields (such as within completely enclosed Faraday cages (which block low-frequency external fields) having radio-frequency (RF) shielding (which block high-frequency external fields) that are measuring very small parameters such as extremely low-voltage circuits where the presence of a person or magnetic mechanical movement device (such as a magnetic linear positioner, rotary motor, or pump) would change the field, but which use the mechanical movement device(s) to adjust the configuration of RLC (resistive-inductive-capacitive) components without modifying fields or introducing extraneous capacitances or inductances.

BRIEF DESCRIPTION OF THE DRAWINGS

FIG. 1E is a block diagram of an RF trap system that uses an RF trap apparatus on a shielded cable, according to some embodiments of the present invention.

FIG. 1F is a block diagram of RF trap apparatus, according to some embodiments of the present invention.

FIG. 1G is a perspective view of a shielded cable having a plurality of inner conductors, according to some embodiments of the present invention.

FIG. 1H is a perspective front-end view computer-model image of RF trap apparatus, according to some embodiments of the present invention.

FIG. 1I is a perspective back-end view computer-model image of RF trap apparatus, according to some embodiments of the present invention.

FIG. 1J is a perspective view of a shielded cable having a single inner conductor, according to some embodiments of the present invention.

FIG. 1K is a perspective view of a RF trap system that has shielded cable wrapped with conductor tape that includes a plurality of piercing points that conduct RF between the conductor tape and the shield of cable, according to some embodiments of the present invention.

FIG. 1L is an end cross section view of RF trap system wrapped with conductor tape that uses an RF trap apparatus on a shielded cable, according to some embodiments of the present invention.

FIG. 1M is a perspective view of RF trap system wrapped with conductor tape, which uses an RF trap apparatus on a shielded cable, according to some embodiments of the present invention.

FIG. 1N is an end cross section view of RF trap system wrapped with conductor tape that uses an RF trap apparatus on a shielded cable, according to some embodiments of the present invention.

FIG. 1O is a perspective view of RF trap system wrapped with conductor tape that uses an RF trap apparatus on a shielded cable, according to some embodiments of the present invention.

FIG. 1P is a block diagram of an RF trap system that uses an RF trap apparatus on a shielded cable, according to some embodiments of the present invention.

FIG. 1Q is an end cross section view of RF trap system that uses a two-part, interlocking RF trap apparatus on a shielded cable, according to some embodiments of the present invention.

FIG. 1R is a block diagram of an RF trap system that uses an RF trap apparatus on a shielded cable, according to some embodiments of the present invention.

FIG. 1T is a block diagram of an RF trap system that uses an RF trap apparatus on a shielded cable, according to some embodiments of the present invention.

FIG. 1U is a block diagram of an RF trap system that uses an RF trap apparatus on a shielded cable, according to some embodiments of the present invention.

FIG. 1V is an end cross section view of RF trap system that uses a two-part, interlocking RF trap apparatus on a shielded cable, according to some embodiments of the present invention.

FIG. 1W is a block diagram of an RF trap system that uses an RF trap apparatus on a shielded cable, according to some embodiments of the present invention.

FIG. 1X is a block diagram of an RF trap system that uses an RF trap apparatus on a shielded cable, according to some embodiments of the present invention.

FIG. 3 is a schematic diagram of a transmission line used in some embodiments of the present invention.

FIG. 4A is a schematic diagram of a tee network used in some embodiments of the present invention.

FIG. 4B is a schematic diagram of a tee network used in some embodiments of the present invention.

FIG. 5A is a schematic diagram of a pi network used in some embodiments of the present invention.

FIG. 5B is a schematic diagram of another pi network used in some embodiments of the present invention.

FIG. 6A is a schematic diagram of a quad combiner used in some embodiments of the present invention.

FIG. 6B is a schematic diagram of another quad combiner used in some embodiments of the present invention.

DESCRIPTION OF PREFERRED EMBODIMENTS

Although the following detailed description contains many specifics for the purpose of illustration, a person of ordinary skill in the art will appreciate that many variations and alterations to the following details are within the scope of the invention. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

As used herein, a non-magnetic mechanical movement device is any electrically-controlled device (such as a linear positioner, rotary motor, or pump) made of materials that do not move (or move to a substantially negligible amount) due to a high magnetic field when subjected to the high magnetic field. Such devices can be placed within the high magnetic field of a magnetic-resonance machine or the superconducting magnet of a particle accelerator without the danger of the device moving due to the magnetic field and/or without the undesirable result of changing the magnetic field due to their presence. In many of the descriptions herein, the term "motor" (such as motor 140) will be used as an example of such a non-magnetic mechanical movement device, however one of skill in the art will recognize that in other embodiments, the "motor" can be implemented as a linear or rotary motor device using suitable linkages, or as a pump that uses a liquid or pneumatic fluid to effectuate the described movement.

Figure 1A:
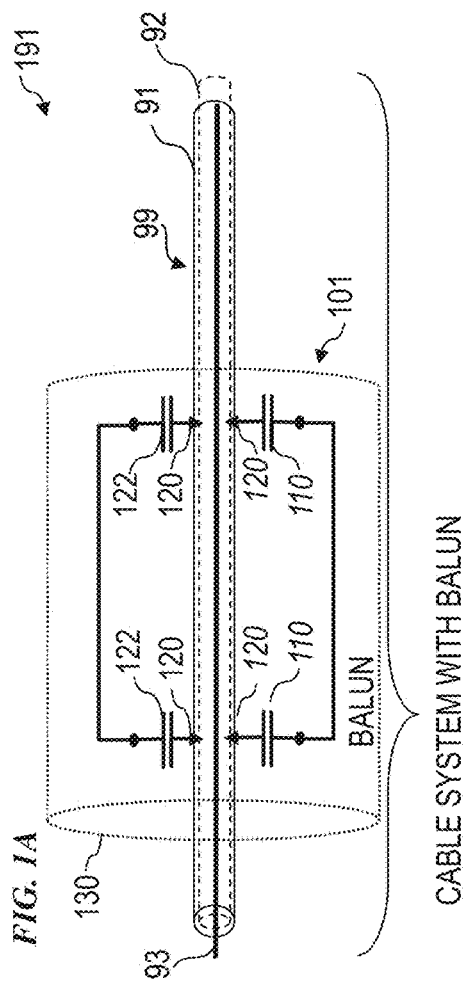
FIG. 1A is a block diagram of an RF trap system that uses an RF trap apparatus on a shielded cable, according to some embodiments of the present invention.

FIG. 1A is a block diagram of an RF trap system 191 that uses an RF trap apparatus 101, having a case 130, on a shielded cable 99, according to some embodiments of the present invention. In some embodiments, cable 99 includes one or more inner conductors 93 covered with insulator layer 94, and a conductive shield 92 surrounding the insulator layer 94, and an outer insulator layer 91 surrounding the shield 92. In some embodiments, RF trap 101 includes a plurality of pi networks 181, each pi network including a pair of capacitors 122, each capacitor 122 connected between an outer conductor 124 and one of the piercing projections 120 that connects to shield 92 once the RF trap 101 is clamped onto cable 99. In some embodiments, the plurality of pi networks is tuned to a resonance frequency of an RF signal carried by the one or more inner conductors 93. In some embodiments, this tuning creates a high impedance on the outside of the shield 92, thus suppressing RF currents in the shield 92, and/or suppressing RF radiation from shield 92. In some embodiments, the outer conductors 124 form the L component of the pi network shown in FIG. 6C.

In each of the embodiments shown herein, the LC circuits shown can be replaced by one or more of the LC networks shown in the others of the Figures. In some such embodiments, a plurality of such L, C, and transmission line elements are combined to achieve the desired trapping of RF currents on the outer surface of the shield of the shielded cable.

Figure 1B:
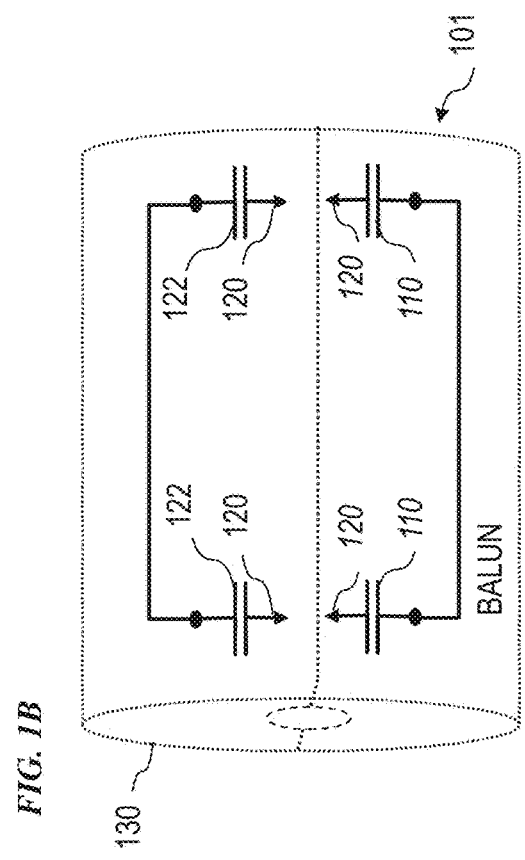
FIG. 1B is a block diagram of RF trap apparatus, according to some embodiments of the present invention.

FIG. 1B is a block diagram of an RF trap apparatus 101 as described in the description of FIG. 1A above, according to some embodiments of the present invention.

Figure 1D:
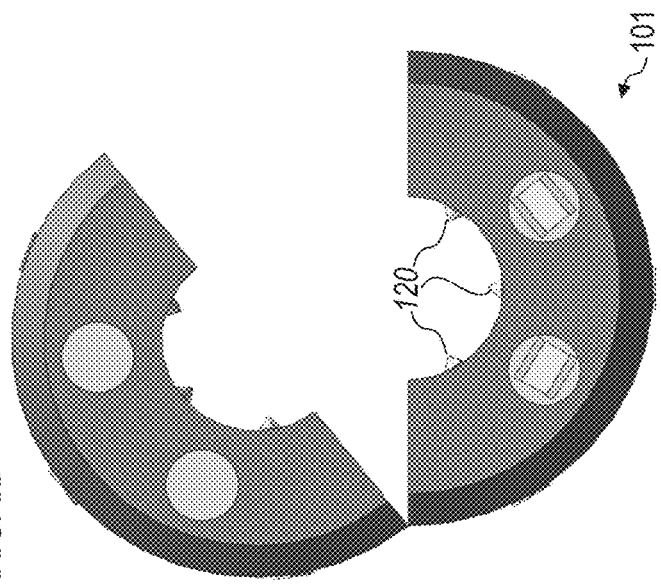
FIG. 1D is an end-view computer-model image of RF trap apparatus, according to some embodiments of the present invention.
Figure 1C:
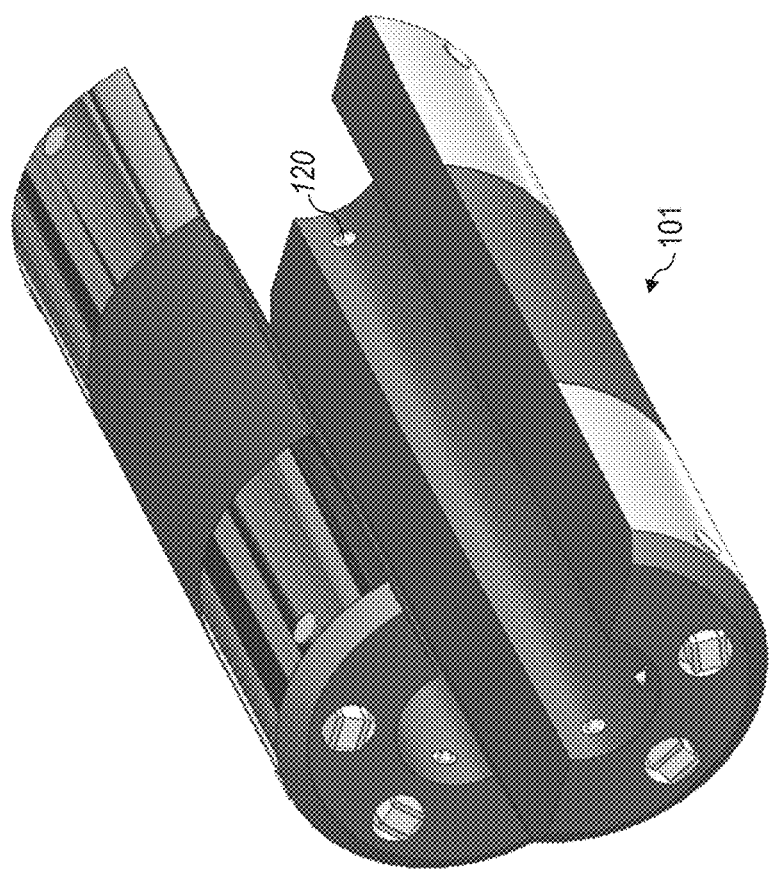
FIG. 1C is a perspective-view computer-model image of RF trap apparatus, according to some embodiments of the present invention.

FIG. 1C is a perspective-view computer-model image of RF trap apparatus 101, according to some embodiments of the present invention.

FIG. 1D is an end-view computer-model image of RF trap apparatus 101, according to some embodiments of the present invention.

FIG. 1E is a block diagram of an RF trap system 192 that uses an RF trap apparatus 101 on a shielded cable 99, according to some embodiments of the present invention.

FIG. 1F is a block diagram of an RF trap apparatus 102, according to some embodiments of the present invention.

FIG. 1G is a perspective view of a shielded cable 98, according to some embodiments of the present invention.

FIG. 1H is a perspective front view computer-model image of RF trap apparatus 101, according to some embodiments of the present invention.

FIG. 1I is a perspective end view computer-model image of RF trap apparatus 101, according to some embodiments of the present invention.

FIG. 1J is a perspective view of a shielded cable 99, according to some embodiments of the present invention.

FIG. 1K is a perspective view of a RF trap system 180 that has shielded cable 98 wrapped with conductor tape 150 that includes a plurality of piercing points that conduct RF between the conductor tape 150 and the shield of cable, according to some embodiments of the present invention.

FIG. 1L is an end cross section view of RF trap system 194 wrapped with conductor tape 150 that uses an RF trap apparatus 104 on a shielded cable 98, according to some embodiments of the present invention.

FIG. 1M is a perspective view of RF trap system 193 wrapped with conductor tape 150, that uses an RF trap apparatus 103 on a shielded cable 98, according to some embodiments of the present invention.

FIG. 1N is an end cross section view of RF trap system 195 wrapped with conductor tape 150 that uses an RF trap apparatus 105 on a shielded cable 98, according to some embodiments of the present invention. As shown in FIG. 1N, RF trap system 105 includes two parts 105A and 105B connected by hinges 152 and latches 151 that form an attachment device, that work along with penetrating projections 120 to hold the case to the shielded RF cable 98 with the LC circuit electrically connected to the shield conductor of the shielded RF cable.

FIG. 1O is an perspective view of RF trap system 195 wrapped with conductor tape 150 that uses an RF trap apparatus 105 on a shielded cable 98, according to some embodiments of the present invention. As shown in FIG. 1O, RF trap system 105 includes latches 151 on each junction of conductor tape 150.

FIG. 1P is a block diagram of an RF trap system 196 that uses an RF trap apparatus 106 on a shielded cable 99, according to some embodiments of the present invention.

FIG. 1Q is an end cross section view of RF trap system 197 that uses a two-part, interlocking RF trap apparatus 107 on a shielded cable 98, according to some embodiments of the present invention. As shown in FIG. 1Q, RF trap apparatus 107 includes two symmetrical parts 107A and 107B each having interlocking latches 131A and 131B on opposite sides of each of the two symmetrical parts 107A and 107B that form an attachment device configured to hold the case to the shielded RF cable and urge penetrating projections 120 to form the LC circuit electrically connected to the shield conductor of the shielded RF cable 98.

FIG. 1R is a block diagram of an RF trap system 198 that uses an RF trap apparatus 108 on a shielded cable 99, according to some embodiments of the present invention.

Figure 1S:
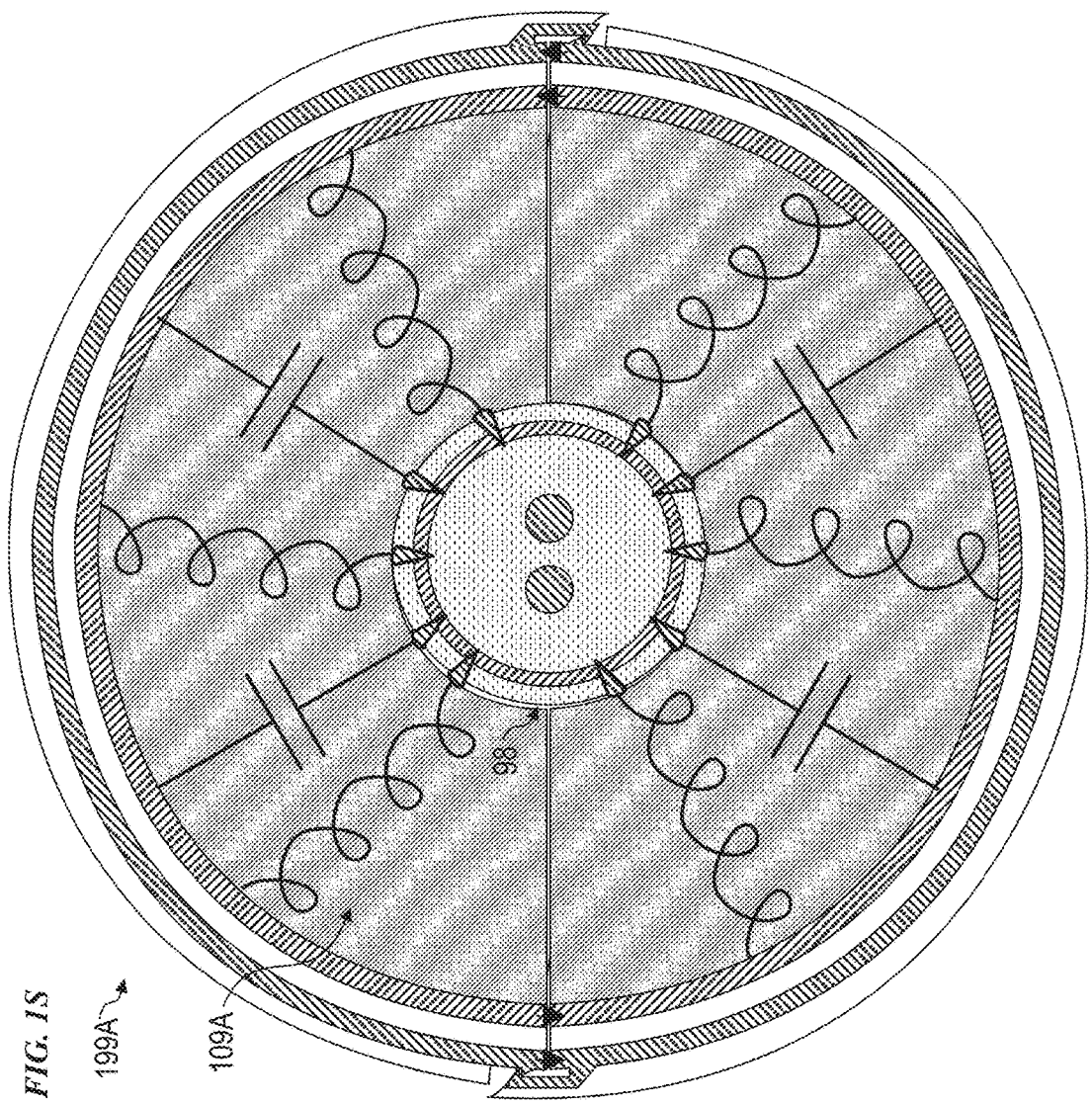
FIG. 1S is an end cross section view of RF trap system that uses a two-part, interlocking RF trap apparatus on a shielded cable, according to some embodiments of the present invention.

FIG. 1S is an end cross section view of RF trap system 199A that uses a two-part, interlocking RF trap apparatus 109A on a shielded cable 98, according to some embodiments of the present invention.

FIG. 1T is a block diagram of an RF trap system 199B that uses an RF trap apparatus 109B on a shielded cable 99, according to some embodiments of the present invention.

FIG. 1U is a block diagram of an RF trap system 199C that uses an RF trap apparatus 109C on a shielded cable 99, according to some embodiments of the present invention.

FIG. 1V is an end cross section view of RF trap system 197B that uses a two-part, interlocking RF trap apparatus 107B on a shielded cable 98, according to some embodiments of the present invention.

FIG. 1W is a block diagram of an RF trap system 199D that uses an RF trap apparatus 109D on a shielded cable 99, according to some embodiments of the present invention.

FIG. 1X is a block diagram of an RF trap system 199E that uses an RF trap apparatus 109E on a shielded cable 99, according to some embodiments of the present invention.

Figure 2:
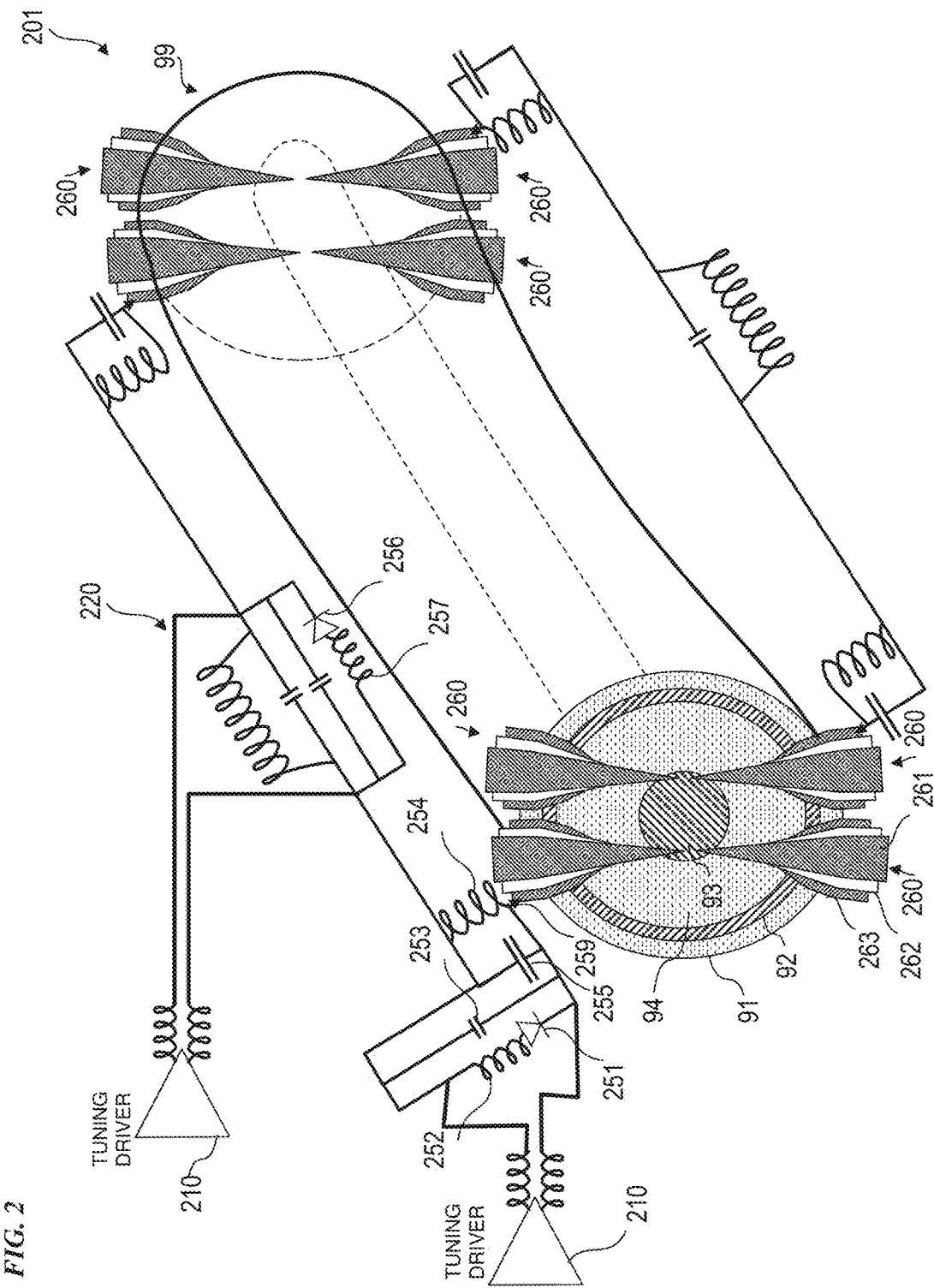
FIG. 2 is a block diagram of system that uses one or more drivers to drive signals to adjust the electrical parameters and/or resonant frequency of the LC circuit to which they are connected.

FIG. 2 is a system 201 that uses one or more drivers 210 to drive signals to adjust the electrical parameters and/or resonant frequency of the LC circuit 220 to which they are connected. In some embodiments, the diode 251 in series with inductance 252 is forward-biased (to include the inductance) or reverse biased (to exclude the inductance) by a variable amount of DC current to allow the inductance 252 to adjust the resonance frequency of the circuit that includes capacitors 253 and 255 and inductances 252 and 254. Similarly, the diode 256 in series with inductance 257 is forward-biased (to include the inductance) or reverse biased (to exclude the inductance) by a variable amount of DC current to allow the inductance 252 to adjust the resonance frequency that part of the circuit. In some embodiments, a plurality of piercing elements 260, each including a central piercing element 261 that conducts electricity to the core conductor 93 of coax 99. An insulating layer 94 surrounds the conductor 93, and insulating layer 262 of each point 260 extends into this insulating layer 94 in order to isolate conductor 261 from the shield 92. An outer conductor 263 on each point 260 extends into the shield 92 to electrically conduct the RF trap signals from the shield to the RF trap 201. In some embodiments, an additional outer insulating layer is provided outside conductor 263 of each point. In some embodiments, each of the electrically tunable circuits 220 includes a varactor capacitor and/or a diode in series with an inductor, whose parameters are electrically adjusted to tune a resonant frequency and set up a high-impedance condition on the outside of the shield.

In some of each of the embodiments described herein, the conductors are made of a conductive metal. In some such embodiments, the conductive metal is non-magnetic, in order that the devices can be used in a high-Tesla magnetic field (e.g., 3 T, 7 T or 10 T and above).

FIG. 3, FIG. 4A, FIG. 4B, FIG. 5A, FIG. 5B, FIG. 6A, FIG. 6B, FIG. 7A, FIG. 7B and FIG. 8 are each LC networks, one or more of which are used singly or as one of a plurality of components distributed around the circumference of the balun as the LC network in some embodiments of the multi-part interlocking balun of the present invention. In some embodiments, such as shown in FIG. 1C, for example, the interlocking balun has two halves that are hinged along one side and that have interlocking latches 131A and 131B (as shown in FIG. 1Q) along the opposite side that form an attachment device configured to hold the case to the shielded RF cable with the LC circuit electrically connected to the shield conductor of the shielded RF cable 98. In other embodiments, such as shown in FIG. 1Q, for example, the interlocking balun has two halves that are symmetrical and that have interlocking latches 131A and 131B as shown in FIG. 1Q along both sides.

FIG. 3 is a schematic diagram of a transmission line that is used in some embodiments of the snap-on RF trap balun of the present invention.

FIG. 4A is a schematic diagram of a tee network that is used in some embodiments of the snap-on RF trap balun of the present invention.

FIG. 4B is a schematic diagram of a tee network that is used in some embodiments of the snap-on RF trap balun of the present invention.

FIG. 5A is a schematic diagram of a pi network that is used in some embodiments of the snap-on RF trap balun of the present invention.

FIG. 5B is a schematic diagram of another pi network that is used in some embodiments of the snap-on RF trap balun of the present invention.

FIG. 6A is a schematic diagram of a quad combiner that is used in some embodiments of the snap-on RF trap balun of the present invention.

FIG. 6B is a schematic diagram of another quad combiner that is used in some embodiments of the snap-on RF trap balun of the present invention.

Figure 7A:
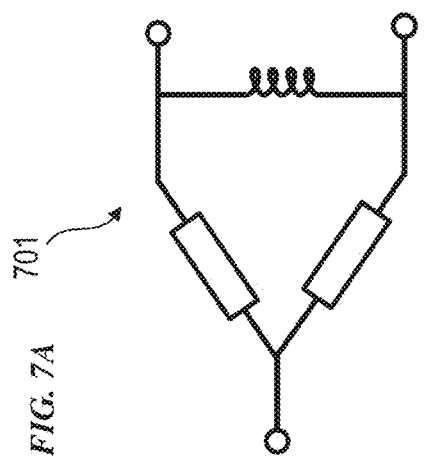
FIG. 7A is a schematic diagram of a Wilkinson power splitter/combiner using quarter-wave transmission line segments used in some embodiments of the present invention.

FIG. 7A is a schematic diagram of a Wilkinson power splitter/combiner using quarter-wave transmission line segments that is used in some embodiments of the snap-on RF trap balun of the present invention.

Figure 7B:
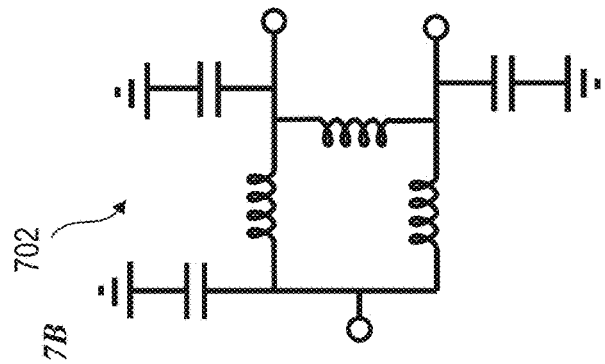
FIG. 7B is schematic diagram of a Wilkinson power splitter/combiner using discrete capacitors and inductances used in some embodiments of the present invention.

FIG. 7B is schematic diagram of a Wilkinson power splitter/combiner using discrete capacitors and inductances that is used in some embodiments of the snap-on RF trap balun of the present invention.

Figure 8:
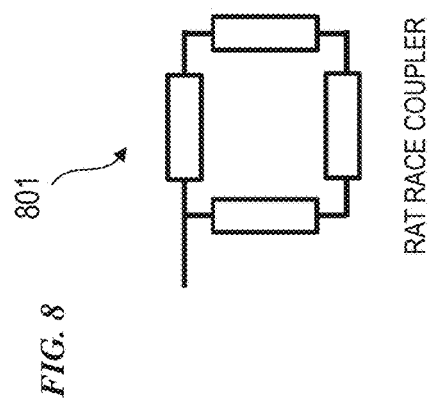
FIG. 8 is a schematic diagram of a rat-race coupler using quarter-wave transmission line segments used in some embodiments of the present invention.

FIG. 8 is a schematic diagram of a rat-race coupler 801 using quarter-wave transmission line segments used in some embodiments of the present invention.

In some embodiments, the system of the present invention includes an RF trap having an LC circuit with one or more adjustable elements (e.g., the inductance and/or capacitance is adjustable), and in some embodiments, the adjustment mechanism includes one or more non-magnetic (e.g., piezoelectric) motors adjusted by its own respective motor controller(s) and feedback circuit(s) to robotically move mechanical parts (levers, hoops, sheets of resilient elastic material, and the like) to achieve robotic control within the high-field or sensitive-field environment in which the RLC and/or antenna elements are adjusted by their own respective motor controllers and feedback circuits. In some such embodiments, the system sets an initial set of parameters (for example, resistance, inductance, capacitance, dielectric shape, frequency, phase, gain/attenuation, temporal properties, spatial properties (the shape of magnetic or electric fields), pulse width, mechanical position and orientation, or other controlled parameter) and a feedback circuit senses the result (one or more characteristics or parameters) and automatically adjusts the components (for example, variable resistors, inductors, capacitors, antennas, dielectric shapes, mechanical positioners and the like) in the system to compensate or control the system to achieve a desired result (e.g., a radar signal, magnetic-resonance or electron-spin image, or other desired system output).

In some embodiments, the one or more non-magnetic (e.g., piezoelectric) motors actuate control over electrical switches, amplitude modulators, frequency controllers, phase controllers, gain controllers, frequency modulators and the like by using, for example, control of variable resistor(s), inductor(s), capacitor(s), antenna(s), dielectric shape(s), mechanical positioner(s) and the like.

In some embodiments, the system uses non-magnetic (e.g., piezoelectric) motors (or other mechanical-movement devices) that include linear actuators, rotary actuators, pumps (pneumatic (pressure or vacuum) and/or liquid pumps) and/or the like. In some embodiments, the system optionally includes non-magnetic sensors (e.g., using piezoelectric or other suitable technologies) that include linear strain gauges, rotary sensors, pressure or sound sensors (e.g., pneumatic (pressure or vacuum) and/or liquid), position sensors, light and image sensors, voltage or current sensors, and/or the like. In some embodiments, such actuator elements and/or sensor elements are used for remotely controlled robotic diagnosis and examination, surgery, biopsy, and the like in a medical environment (such as a magnetic-resonance machine).

In some embodiments, the present invention includes one or more of any one or more of the devices in any of the figures herein in a combined circuit that connects the described variable components, optionally including other conventional components.

In some embodiments, the present invention provides an RF trap for blocking stray signals on a shielded RF cable that has a peripheral shield conductor and at least one inner conductor for carrying RF signals, the RF trap including: a case; an LC circuit that is mounted to the case and that has a resonance frequency at a frequency of RF signals carried on the at least one inner conductor; a piercing structure electrically connected to the LC circuit and configured to pierce and electrically connect the LC circuit to the shield conductor of the shielded RF cable; and an attachment device configured to hold the case to the shielded RF cable with the LC circuit electrically connected to the shield conductor of the shielded RF cable.

In some embodiments, the present invention provides an RF-trap apparatus for blocking stray signals on a shielded RF cable that has a peripheral shield conductor and at least one inner conductor for carrying RF signals. This RF trap apparatus includes: a case; an LC circuit that is mounted to the case and that has a resonance frequency at a frequency of RF signals carried on the at least one inner conductor; a plurality of projections electrically connected to the LC circuit and configured to pierce and electrically connect the LC circuit to the shield conductor of the shielded RF cable; and an attachment device configured to hold the case to the shielded RF cable with the LC circuit electrically connected to the shield conductor of the shielded RF cable.

Some embodiments further include an automatic parameter-adjustment unit operatively coupled to the LC circuit and configured to adjust electrical parameters of the LC circuit to control the resonance frequency of the LC circuit.

Some embodiments further include an automatic parameter-adjustment unit that has a non-magnetic mechanical actuator operatively coupled to the LC circuit and configured to adjust electrical parameters of the LC circuit to control the resonance frequency of the LC circuit.

In some embodiments, the plurality of projections electrically connected to the LC circuit include a first plurality of pointed projections at a first end of the case and a second plurality of pointed projections at a second end of the case opposite the first.

In some embodiments, the plurality of projections electrically connected to the LC circuit include a first plurality of pointed projections at a first end of the case and a second plurality of pointed projections at a second end of the case opposite the first, wherein each one of the first plurality of pointed projections is capacitively coupled to a cylindrical conductor spaced apart from the shield conductor of the shielded RF cable, and wherein each one of the second plurality of pointed projections is capacitively coupled to the cylindrical conductor.

In some embodiments, the plurality of projections electrically connected to the LC circuit include a first plurality of pointed projections only at a first end of the case and no pointed projections at a second end of the case opposite the first, and the LC circuit includes a conductive cylinder that is electrically connected to first plurality of pointed projections only at a first end of the case.

In some embodiments, the LC circuit includes a plurality of pi networks arranged at different radial directions around the shielded RF cable.

In some embodiments, the LC circuit includes a plurality of Tee networks arranged at different radial directions around the shielded RF cable.

In some embodiments, the LC circuit includes a plurality of quad-coupler networks arranged at different radial directions around the shielded RF cable.

In some embodiments, the LC circuit includes a plurality of Wilkenson power-splitter-combiner networks arranged at different radial directions around the shielded RF cable.

In some embodiments, the LC circuit includes a plurality of rat-race-coupler networks arranged at different radial directions around the shielded RF cable.

In some embodiments, the present invention provides a method that includes: providing a case having an LC circuit that is mounted to the case and that has a resonance frequency at a frequency of RF signals carried on the at least one inner conductor; a piercing structure electrically connected to the LC circuit and configured to pierce and electrically connect the LC circuit to the shield conductor of the shielded RF cable; and an attachment device configured to hold the case to the shielded RF cable with the LC circuit electrically connected to the shield conductor of the shielded RF cable.

Some embodiments further include automatically adjusting electrical parameters of the LC circuit to adjust the resonance frequency.

Some embodiments further include automatically adjusting electrical parameters of the LC circuit to adjust the resonance frequency by moving a non-magnetic mechanical-movement device.

In some embodiments of the method, the plurality of projections electrically connected to the LC circuit include a first plurality of pointed projections at a first end of the case and a second plurality of pointed projections at a second end of the case opposite the first.

In some embodiments of the method, the plurality of projections electrically connected to the LC circuit include a first plurality of pointed projections at a first end of the case and a second plurality of pointed projections at a second end of the case opposite the first, wherein each one of the first plurality of pointed projections is capacitively coupled to a cylindrical conductor spaced apart from the shield conductor of the shielded RF cable, and wherein each one of the second plurality of pointed projections is capacitively coupled to the cylindrical conductor.

In some embodiments of the method, the plurality of projections electrically connected to the LC circuit include a first plurality of pointed projections only at a first end of the case and no pointed projections at a second end of the case opposite the first, and the LC circuit includes a conductive cylinder that is electrically connected to first plurality of pointed projections only at a first end of the case.

In some embodiments of the method, the LC circuit includes a plurality of pi networks arranged at different radial directions around the shielded RF cable.

In some embodiments, the LC circuit includes a plurality of Tee networks arranged at different radial directions around the shielded RF cable.

In some embodiments of the method, the LC circuit includes a plurality of quad-coupler networks arranged at different radial directions around the shielded RF cable.

In some embodiments of the method, the LC circuit includes a plurality of Wilkenson power-splitter-combiner networks arranged at different radial directions around the shielded RF cable.

In some embodiments of the method, the LC circuit includes a plurality of rat-race-coupler networks arranged at different radial directions around the shielded RF cable.

In some embodiments, the present invention provides a non-transitory computer-readable medium having instructions stored thereon for causing a suitably programmed information processor to execute a method that comprises: autocontrolling an electrical parameter of an LC circuit that is mounted to a case of a snap-on balun attached to a shielded RF cable that has a peripheral shield conductor and at least one inner conductor for carrying RF signals, wherein the LC circuit has a resonance frequency at a frequency of RF signals carried on the at least one inner conductor, wherein the case includes a piercing structure electrically connected to the LC circuit and configured to pierce and electrically connect the LC circuit to the shield conductor of the shielded RF cable. In some embodiments of the computer-readable medium, the method further includes using a feedback signal operatively coupled to the programmable information-processing device to provide feedback control in order to maintain the electrical parameter of the LC circuit.

In some embodiments of the computer-readable medium, the method further includes controlling resistance, inductance and capacitance (RLC) values of the LC circuit.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first, " "second," and "third," etc., are used merely as labels, and are not intended to impose numerical requirements on their objects.

What is claimed is:

1. An RF-trap apparatus for blocking stray signals on a transmission line that has a plurality of conductors for carrying RF signals from a first end of the transmission line to a second end of the transmission line and an insulating layer that surrounds the plurality of conductors, wherein a distance between the first end and the second end defines a length of the transmission line, the RF trap apparatus comprising:
   a case that is shorter than the length of the transmission line;
   an electrically tunable LC circuit that is mounted to the case and that has a resonance frequency that is tunable to a frequency of the RF signals carried on at least one of the plurality of conductors;
   a plurality of electrical connections connected to the electrically tunable LC circuit and configured to electrically connect the electrically tunable LC circuit to at least a first one of the plurality of conductors of the transmission line; and
   an attachment device configured to hold the case to the transmission line with the electrically tunable LC circuit electrically connected to the transmission line.

2. The apparatus of claim 1, further comprising:
   an automatic parameter-adjustment unit operatively coupled to the electrically tunable LC circuit and configured to adjust electrical parameters of the electrically tunable LC circuit to control the resonance frequency of the electrically tunable LC circuit.

3. The apparatus of claim 1, further comprising:
an automatic parameter-adjustment unit, wherein the automatic parameter-adjustment unit includes a non-magnetic mechanical actuator operatively coupled to the electrically tunable LC circuit and configured to adjust electrical parameters of the electrically tunable LC circuit to control the resonance frequency of the electrically tunable LC circuit.

4. The apparatus of claim 1, wherein the electrically tunable LC circuit includes a plurality of pi networks arranged at a plurality of different radial directions relative to the transmission line.

5. The apparatus of claim 1, wherein the plurality of electrical connections includes a first pointed projection having a first outer conductor and a second inner conductor, wherein the first outer conductor is coaxial and surrounding the second inner conductor, wherein the first pointed projection further includes an insulating layer that separates the first outer conductor from the second inner conductor of the first pointed projection, wherein the plurality of electrical connections also includes a second pointed projection having a first outer conductor and a second inner conductor, wherein the first outer conductor is coaxial and surrounding the second inner conductor, wherein the first pointed projection further includes an insulating layer that separates the first outer conductor from the second inner conductor of the second pointed projection, wherein the first pointed projection is closer to a first end of the case than is the second pointed projection, wherein the second pointed projection is closer to a second end of the case than is the first pointed projection, wherein the electrically tunable LC circuit is electrically connected to and between the first outer conductor of the first pointed projection and the first conductor of the second pointed projection, wherein the first outer conductor of the first pointed projection electrically contacts the first one of the plurality of conductors of the transmission line, and wherein the second inner conductor of the first pointed projection electrically contacts a second one of the plurality of conductors of the transmission line, and wherein the first outer conductor of the second pointed projection electrically contacts the first one of the plurality of conductors of the transmission line, and wherein the second inner conductor of the second pointed projection electrically contacts the second one of the plurality of conductors of the transmission line.

6. The apparatus of claim 1, wherein the plurality of electrical connections includes a first plurality of pointed projections only at a first end of the case and no pointed projections at a second end of the case opposite the first end, and the electrically tunable LC circuit includes a first conductor having an internal surface area facing and spaced apart from the transmission line, wherein the first conductor is electrically connected to the first plurality of pointed projections only at the first end of the case.

7. The apparatus of claim 1, wherein the plurality of electrical connections includes a first pointed projection and a second pointed projection, wherein the first pointed projection is closer to a first end of the case than is the second pointed projection, wherein the second pointed projection is closer to a second end of the case than is the first pointed projection, and wherein the electrically tunable LC circuit is electrically connected to and between the first pointed projection and the second pointed projection.

8. The apparatus of claim 1, wherein the plurality of electrical connections includes a first pointed projection having a first outer conductor and a second inner conductor, wherein the first outer conductor is coaxial and surrounding the second inner conductor, wherein the first pointed projection further includes an insulating layer that separates the first outer conductor from the second inner conductor of the first pointed projection, wherein the plurality of electrical connections also includes a second pointed projection having a first conductor, wherein the first pointed projection is closer to a first end of the case than is the second pointed projection, wherein the second pointed projection is closer to a second end of the case than is the first pointed projection, wherein the electrically tunable LC circuit is electrically connected to and between the first outer conductor of the first pointed projection and the first conductor of the second pointed projection, wherein the first outer conductor of the first pointed projection electrically contacts the first one of the plurality of conductors of the transmission line, and wherein the second inner conductor of the first pointed projection electrically contacts a second one of the plurality of conductors of the transmission line, and wherein the first conductor of the second pointed projection electrically contacts the first one of the plurality of conductors of the transmission line.

9. An RF-trap apparatus for blocking stray signals on a transmission line that has a plurality of conductors for carrying RF signals and an insulating layer, the RF trap apparatus comprising:
a case;
an electrically tunable LC circuit that is mounted to the case and that has a resonance frequency that is tunable to a frequency of the RF signals carried on at least one of the plurality of conductors;
a plurality of electrical connections connected to the electrically tunable LC circuit and configured to electrically connect the electrically tunable LC circuit to at least a first one of the plurality of conductors of the transmission line; and
an attachment device configured to hold the case to the transmission line with the electrically tunable LC circuit electrically connected to the transmission line, wherein the plurality of electrical connections includes a first plurality of pointed projections at a first end of the case.

10. The apparatus of claim 9, wherein the case includes a first conductor, wherein the first conductor has an internal surface area facing and spaced apart from the transmission line, wherein the plurality of electrical connections includes the first plurality of pointed projections at a first end of the case and a second plurality of pointed projections at a second end of the case opposite the first end, wherein each one of the first plurality of pointed projections is electrically coupled to the first conductor, and wherein each one of the second plurality of pointed projections is electrically coupled to the first conductor.

11. A method for trapping RF current on a transmission line, the transmission line including a plurality of conductors for carrying a plurality of RF signals and an insulating layer, the method comprising:
providing a case containing an electrically tunable LC circuit that is tunable to a resonance frequency of at least one of the plurality of RF signals carried on at least one of the plurality of conductors of the transmission line;
electrically connecting the LC circuit to at least one of the plurality of conductors of the transmission line using a plurality of piercing projections; and
electrically adjusting the resonance frequency of the LC circuit.

12. The method of claim 11, further comprising:
automatically adjusting electrical parameters of the LC circuit to adjust the resonance frequency.

13. The method of claim 11, wherein the electrically connecting includes piercing the insulating layer with a first piercing projection and a second piercing projection, such that the first piercing projection pierces the insulating layer closer to a first end of the case than is the second piercing projection, and the second piercing projection pierces the insulating layer closer to a second end of the case than is the first piercing projection.

14. The method of claim 11, wherein the providing of the case includes providing a first conductor, wherein the first conductor has an internal surface area facing and spaced apart from the transmission line, wherein the electrically connecting includes piercing the insulating layer with a first plurality of pointed projections at a first end of the case and a second plurality of pointed projections at a second end of the case opposite the first end, wherein the piercing of the insulating layer and electrically connecting the LC circuit includes electrically coupling each one of the first plurality of pointed projections to the first conductor at the first end of the case, and electrically coupling each one of the second plurality of pointed projections to the first conductor at the second end of the case.

15. The method of claim 11, wherein the electrically connecting includes piercing the insulating layer with a first plurality of pointed projections at a first end of the case and a second plurality of pointed projections at a second end of the case opposite the first end, wherein each one of the first plurality of pointed projections is capacitively coupled to a cylindrical conductor spaced apart from the transmission line, and wherein each one of the second plurality of pointed projections is capacitively coupled to the cylindrical conductor.

16. The method of claim 11, wherein the electrically connecting includes piercing the insulating layer with a first plurality of pointed projections only at a first end of the case and not piercing the insulating layer at a second end of the case opposite the first end, and the LC circuit includes a conductive cylinder that is electrically connected to the first plurality of pointed projections only at the first end of the case.

17. The method of claim 11, further comprising:
arranging a plurality of pi networks at a plurality of different radial directions relative to the transmission line.

18. The method of claim 11, further comprising:
arranging a plurality of Tee networks at a plurality of different radial directions relative to the transmission line.

19. The method of claim 11, further comprising:
arranging a plurality of quad-coupler networks at a plurality of different radial directions relative to the transmission line.

20. An apparatus for trapping RF current on a transmission line, the transmission line including a plurality of conductors for carrying RF signals and an insulating layer, the apparatus comprising:
a case containing an LC circuit that is tunable to a resonance frequency of at least one of the RF signals carried on at least one of the plurality of conductors of the transmission line;
means for electrically connecting the LC circuit to at least one of the plurality of conductors of the transmission line; and
means for electrically adjusting the resonance frequency of the LC circuit.

* * * * *